United States Patent
Flasck et al.

(10) Patent No.: US 7,091,736 B2
(45) Date of Patent: *Aug. 15, 2006

(54) METHOD AND APPARATUS FOR SELECTING MULTIPLE SETTINGS FOR AN INTEGRATED CIRCUIT FUNCTION

(75) Inventors: Jeremy M. Flasck, Fremont, CA (US); Andrew J. Burstein, Fremont, CA (US); David B. Lidsky, Oakland, CA (US); Michael D. McJimsey, Danville, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/130,614

(22) Filed: May 16, 2005

(65) Prior Publication Data
US 2005/0231406 A1 Oct. 20, 2005

Related U.S. Application Data

(63) Continuation of application No. 10/152,245, filed on May 21, 2002, now Pat. No. 6,894,501.

(51) Int. Cl.
*G01R 31/26* (2006.01)
(52) U.S. Cl. .......................... 324/763; 324/765
(58) Field of Classification Search ............... 324/416, 324/115, 763, 603; 326/38; 714/724
See application file for complete search history.

(56) References Cited

U.S. PATENT DOCUMENTS

| | | | |
|---|---|---|---|
| 5,260,949 A * | 11/1993 | Hashizume et al. | 714/731 |
| 5,631,941 A | 5/1997 | Shou et al. | |
| 5,937,180 A * | 8/1999 | Lindqvist | 703/17 |
| 6,035,430 A * | 3/2000 | Taniguchi | 714/724 |
| 6,434,201 B1 | 8/2002 | Ohno | |
| 6,727,721 B1 * | 4/2004 | Altrichter et al. | 324/763 |
| 6,894,501 B1 * | 5/2005 | Flasck et al. | 324/416 |
| 2004/0000926 A1 * | 1/2004 | Ooshita | 326/30 |
| 2004/0124875 A1 * | 7/2004 | Dabral et al. | 326/38 |
| 2005/0156615 A1 * | 7/2005 | Saitou et al. | 324/763 |

FOREIGN PATENT DOCUMENTS

WO WO 9723827 A1 * 7/1997

OTHER PUBLICATIONS

Japanese Patent Abstract, JP 04-207814.
IBM Technical Disclosure Bulletin, vol. 14, Issue No. 12 pp. 3828-3830, May 1972.

* cited by examiner

*Primary Examiner*—Anjan Deb
(74) *Attorney, Agent, or Firm*—Fish & Richardson P.C.

(57) ABSTRACT

A method and apparatus for determining a setting specified from a plurality of the settings for a function provided in an integrated circuit, wherein the setting is specified by connecting an external measurement resistor to a measurement terminal of the integrated circuit, comprises applying a direct current to the measurement terminal of the integrated circuit, thereby producing a measurement voltage at the measurement terminal; applying the direct current to a reference terminal of the integrated circuit, wherein the reference terminal has an external reference resistor connected thereto, thereby producing a reference voltage at the reference terminal; quantizing a voltage level of a difference voltage representing a voltage difference between the reference voltage and the measurement voltage, thereby producing a quantized voltage; and providing control signals to a functional module within the integrated circuit, the control signals representing the one of the settings corresponding to the quantized voltage, wherein each of the settings is represented by a different quantized voltage; wherein the functional module implements the one of the settings represented by the control signals.

20 Claims, 13 Drawing Sheets

METHOD AND APPARATUS FOR SELECTING MULTIPLE SETTINGS FOR AN INTEGRATED CIRCUIT FUNCTION

CROSS-REFERENCE TO RELATED APPLICATIONS

Under 35 U.S.C. 120, this application is a continuation application of and claims priority to U.S. Pat. application Ser. No. 10/152,245, filed May 21, 2002 now U.S. Pat. No. 6,894,501, the entire contents of which are incorporated herein by reference.

BACKGROUND

The present invention relates generally to integrated circuits, and particularly to selecting the settings in an integrated circuit by connecting external devices, such as resistors, capacitors, and the like, to terminals of the integrated circuit.

It is common for an integrated circuit to provide a function having multiple settings that can be selected during the manufacture of a device that incorporates the integrated circuit, such as a printed circuit board. A setting is selected by applying digital inputs to terminals reserved for that purpose, for example by connecting each terminal to a high voltage, such as the power supply, or to a low voltage, such as ground. Thus for an integrated circuit using binary digital logic, a function having three possible settings requires that two terminals be dedicated to detecting the digital inputs that select one of the three settings. The number of functions and settings that an integrated circuit can provide is generally limited by the number of available terminals.

However, the terminals of an integrated circuit are a scarce resource. In relative terms, the designers of an integrated circuit are often limited less by the number of devices a package for an integrated circuit can contain than by the number of terminals the package can accommodate. For example, design and cost goals such as minimizing pin count (that is, the number of terminals of an integrated circuit) and real estate (that is, the area occupied by an integrated circuit) require that the number of terminals be minimized. Thus the number of functions and settings is often constrained by the number of available terminals.

SUMMARY

In general, in one aspect, the invention features a method and apparatus for determining a setting specified from a plurality of the settings for a function provided in an integrated circuit, wherein the setting is specified by connecting an external measurement resistor to a measurement terminal of the integrated circuit. It comprises applying a direct current to the measurement terminal of the integrated circuit, thereby producing a measurement voltage at the measurement terminal; applying the direct current to a reference terminal of the integrated circuit, wherein the reference terminal has an external reference resistor connected thereto, thereby producing a reference voltage at the reference terminal; quantizing a voltage level of a difference voltage representing a voltage difference between the reference voltage and the measurement voltage, thereby producing a quantized voltage; and providing control signals to a functional module within the integrated circuit, the control signals representing the one of the settings corresponding to the quantized voltage, wherein each of the settings is represented by a different quantized voltage; wherein the functional module implements the one of the settings represented by the control signals.

Particular implementations can include one or more of the following features. Quantizing a voltage level of a difference voltage comprises determining a polarity of the difference voltage. The integrated circuit is a switching voltage regulator; and the function comprises at least one of selectable switching frequency, selectable set point, selectable droop level, and selectable digital compensation mode.

In general, in one aspect, the invention features a method and apparatus for determining a setting specified from a plurality of the settings for a function provided in an integrated circuit, wherein the setting is specified by connecting an external resistor to a terminal of the integrated circuit. It comprises applying a direct current to the terminal of the integrated circuit, thereby producing a voltage at the terminal; quantizing a voltage level of the voltage, thereby producing a quantized voltage; and providing control signals to a functional module within the integrated circuit, the control signals representing the one of the settings corresponding to the quantized voltage, wherein each of the settings is represented by a different quantized voltage, wherein the functional module implements the one of the settings represented by the control signals.

In general, in one aspect, the invention features a method and apparatus for determining a setting specified from a plurality of the settings for a function provided in an integrated circuit, wherein the setting is specified by connecting an external measurement capacitor to a measurement terminal of the integrated circuit. It comprises applying a direct current to the measurement terminal of the integrated circuit, thereby producing a measurement voltage transient; quantizing a measurement interval required for a voltage level of the measurement voltage transient to reach a predetermined voltage threshold, thereby producing a quantized measurement interval; applying the direct current to a reference terminal of the integrated circuit, the reference terminal having an external reference capacitor connected thereto, thereby producing a reference voltage transient; quantizing a reference interval required for a voltage level of the reference voltage transient to reach the predetermined voltage threshold, thereby producing a quantized reference interval; generating a result of a function of the quantized measurement interval and the quantized reference interval; and providing control signals to a functional module within the integrated circuit, the control signals representing the one of the settings corresponding to a value of the result, wherein each of the settings is represented by a different value of the result; wherein the functional module implements the one of the settings represented by the control signals.

Particular implementations can include one or more of the following features. Generating a result of a function of the quantized measurement interval and the quantized reference interval comprises determining a ratio of the quantized measurement interval and the quantized reference interval, thereby producing the result. Implementations can comprise discharging the external measurement capacitor before applying the direct current to the external measurement capacitor; and discharging the external reference capacitor before applying the direct current to the external reference capacitor. The integrated circuit is a switching voltage regulator; and the function comprises at least one of selectable switching frequency, selectable set point, selectable droop level, and selectable digital compensation mode.

In general, in one aspect, the invention features a method and apparatus for determining a setting specified from a plurality of the settings for a function provided in an integrated circuit, wherein the setting is specified by connecting an external capacitor to a terminal of the integrated circuit. It comprises applying a direct current to the terminal of the integrated circuit, thereby producing a voltage transient; quantizing an interval required for a voltage level of the voltage transient to reach a predetermined voltage threshold, thereby producing a quantized interval; and providing control signals to a functional module within the integrated circuit, the control signals representing the one of the settings corresponding to the quantized interval, wherein the functional module implements the one of the settings represented by the control signals.

In general, in one aspect, the invention features a method and apparatus for determining settings specified from a plurality of the settings for functions provided in an integrated circuit, wherein the settings are specified by connecting an external measurement capacitor to a measurement terminal of the integrated circuit and connecting an external measurement resistor between the measurement terminal and a common terminal of the integrated circuit. It comprises applying a first direct current to the measurement terminal of the integrated circuit while the common terminal is connected to a predetermined voltage, thereby producing a measurement voltage at the measurement terminal; applying the first direct current to a reference terminal of the integrated circuit, wherein an external reference resistor is connected between the reference terminal and the common terminal of the integrated circuit, while the common terminal is connected to the predetermined voltage, thereby producing a reference voltage at the reference terminal; quantizing a voltage level of a difference voltage representing a voltage difference between the reference voltage and the measurement voltage, thereby producing a quantized voltage; applying a second direct current to the measurement terminal of the integrated circuit while the common terminal of the integrated circuit is not connected to the predetermined voltage, thereby producing a measurement voltage transient; quantizing a measurement interval required for a voltage level of the measurement voltage transient to reach a predetermined voltage threshold, thereby producing a quantized measurement interval; applying the second direct current to the reference terminal of the integrated circuit while the common terminal is not connected to the predetermined voltage, the reference terminal having an external reference capacitor connected thereto, thereby producing a reference voltage transient; quantizing a reference interval required for a voltage level of the reference voltage transient to reach the predetermined voltage threshold, thereby producing a quantized reference interval; generating a result of a function of the quantized measurement interval and the quantized reference interval; providing first control signals to a first functional module within the integrated circuit, the control signals representing the one of the settings corresponding to the quantized voltage, wherein each of a first group of the settings is represented by a different quantized voltage, wherein the first functional module implements the one of the settings represented by the first control signals; and providing second control signals to a second functional module within the integrated circuit, the second control signals representing the one of the settings corresponding to a value of the result, wherein each of a second group of the settings is represented by a different value of the result, wherein the second functional module implements the one of the settings represented by the second control signals.

Particular implementations can include one or more of the following features. Quantizing a voltage level of a difference voltage comprises determining a polarity of the difference voltage. Generating a result of a function of the quantized measurement interval and the quantized reference interval comprises determining a ratio of the quantized measurement interval and the quantized reference interval, thereby producing the result. Implementations can comprise discharging the external measurement capacitor before applying the second direct current to the external measurement capacitor; and discharging the external reference capacitor before applying the second direct current to the external reference capacitor. The integrated circuit is a switching voltage regulator; and the functions comprise at least one of selectable switching frequency, selectable set point, selectable droop level, and selectable digital compensation mode.

In general, in one aspect, the invention features an apparatus for determining settings specified from a plurality of the settings for functions provided in an integrated circuit, wherein the settings are specified by connecting an external capacitor to a terminal of the integrated circuit and connecting an external resistor between the terminal and a common terminal of the integrated circuit. It comprises applying a first direct current to the terminal of the integrated circuit while the common terminal of the integrated circuit is connected to a predetermined voltage, thereby producing a voltage at the terminal; quantizing a voltage level of the voltage, thereby producing a quantized voltage; applying a second direct current to the terminal of the integrated circuit while the common terminal of the integrated circuit is not connected to the predetermined voltage, thereby producing a voltage transient; quantizing an interval required for a voltage level of the voltage transient to reach a predetermined voltage threshold, thereby producing a quantized interval; providing first control signals to a first functional module within the integrated circuit, the control signals representing the one of the settings corresponding to the quantized voltage, wherein each of the settings is represented by a different quantized voltage, wherein the first functional module implements the one of the settings represented by the first control signals; and providing second control signals to a second functional module within the integrated circuit, the second control signals representing the one of the settings corresponding to the quantized interval, wherein each of the settings is represented by a different quantized interval, wherein the second functional module implements the one of the settings represented by the second control signals.

In general, in one aspect, the invention features an apparatus for determining a setting specified from a plurality of the settings for a function provided in an integrated circuit, wherein the setting is specified by connecting an external measurement resistor to a measurement terminal of the integrated circuit. It comprises a current mirror to apply a direct current to the measurement terminal and a reference terminal of the integrated circuit, wherein the reference terminal has an external reference resistor connected thereto, thereby producing a measurement voltage at the measurement terminal and a reference voltage at the reference terminal; and an analog-to-digital converter to quantize a difference voltage representing a voltage difference between the reference voltage and the measurement voltage, thereby producing a quantized voltage, and to provide control signals to a functional module within the integrated circuit, the control signals representing the one of the settings corresponding to the quantized voltage, wherein each of the settings is represented by a different quantized voltage;

wherein the functional module implements the one of the settings represented by the control signals.

Particular implementations can include one or more of the following features. The analog-to-digital converter comprises a comparator to determine a polarity of the difference voltage, wherein the control signals include a polarity signal representing the polarity of the difference voltage. Implementations can comprise a crossing network to swap connections between the current mirror and the measurement and reference terminals in response to the polarity signal, thereby ensuring that the difference voltage is positive when quantizing the difference voltage. The integrated circuit is a switching voltage regulator; and the functions comprise at least one of selectable switching frequency, selectable set point, selectable droop level, and selectable digital compensation mode.

In general, in one aspect, the invention features an apparatus for determining a setting specified from a plurality of the settings for a function provided in an integrated circuit, wherein the setting is specified by connecting an external resistor to a terminal of the integrated circuit. It comprises a current source to apply a direct current to the terminal of the integrated circuit, thereby producing a voltage at the terminal; and an analog-to-digital converter to quantize a voltage level of the voltage, thereby producing a quantized voltage, and to provide control signals to a functional module within the integrated circuit, the control signals representing the one of the settings corresponding to the quantized voltage, wherein each of the settings is represented by a different quantized voltage; wherein the functional module implements the one of the settings represented by the control signals.

In general, in one aspect, the invention features an apparatus for determining a setting specified from a plurality of the settings for a function provided in an integrated circuit, wherein the setting is specified by connecting an external measurement capacitor to a measurement terminal of the integrated circuit. It comprises a current source to provide a direct current; a multiplexer to apply the direct current to one of the measurement terminal and a reference terminal of the integrated circuit in response to a select signal, the reference terminal having an external reference capacitor connected thereto, thereby producing a measurement voltage transient when the direct current is applied to the measurement terminal, and producing a reference voltage transient when the direct current is applied to the reference terminal; and an analog-to-digital converter to provide the select signal, to quantize a result of a function of a measurement interval required for a voltage level of the measurement voltage transient to reach a predetermined voltage threshold and a reference interval required for a voltage level of the measurement voltage transient to reach the predetermined voltage threshold, and to provide control signals to a functional module within the integrated circuit, the control signals representing the one of the settings corresponding to a value of the result, wherein each of the settings is represented by a different value of the result; wherein the functional module implements the one of the settings represented by the control signals.

Particular implementations can include one or more of the following features. The analog-to-digital converter quantizes a ratio of the measurement interval and the reference interval, thereby producing the result. Implementations can comprise a measurement switch to discharge the external measurement capacitor before applying the direct current to the external measurement capacitor; and a reference switch to discharge the external reference capacitor before applying the direct current to the external reference capacitor. The integrated circuit is a switching voltage regulator; and the function comprises at least one of selectable switching frequency, selectable set point, selectable droop level, and selectable digital compensation mode.

In general, in one aspect, the invention features an apparatus for determining a setting specified from a plurality of the settings for a function provided in an integrated circuit, wherein the setting is specified by connecting an external capacitor to a terminal of the integrated circuit. It comprises a current source to apply a direct current to the terminal of the integrated circuit, thereby producing a voltage transient; and an analog-to-digital converter to quantize an interval required for a voltage level of the voltage transient to reach a predetermined voltage threshold, and to provide control signals to a functional module within the integrated circuit, the control signals representing the one of the settings corresponding to the interval, wherein each of the settings is represented by a different interval; wherein the functional module implements the one of the settings represented by the control signals.

In general, in one aspect, the invention features an apparatus for determining settings specified from a plurality of the settings for functions provided in an integrated circuit, wherein the settings are specified by connecting an external measurement capacitor to a measurement terminal of the integrated circuit and connecting an external measurement resistor between the measurement terminal and a common terminal of the integrated circuit. It comprises a current mirror to apply a first direct current to the measurement terminal and a reference terminal of the integrated circuit while the common terminal is connected to a predetermined voltage, wherein the reference terminal has an external reference resistor connected thereto, thereby producing a measurement voltage at the measurement terminal and a reference voltage at the reference terminal; a first analog-to-digital converter to quantize a difference voltage representing a voltage difference between the reference voltage and the measurement voltage, thereby producing a quantized voltage, and to provide first control signals to a first functional module within the integrated circuit, the first control signals representing the one of the settings corresponding to the quantized voltage, wherein each of a first group of the settings is represented by a different quantized voltage; wherein the first functional module implements the one of the settings represented by the first control signals; a current source to provide a second direct current; a multiplexer to apply the second direct current to one of the measurement terminal and the reference terminal of the integrated circuit, in response to a select signal, while the common terminal is not connected to the predetermined voltage, the reference terminal having an external reference capacitor connected thereto, thereby producing a measurement voltage transient when the direct current is applied to the measurement terminal, and producing a reference voltage transient when the direct current is applied to the reference terminal; and a second analog-to-digital converter to provide the select signal, to quantize a result of a function of a measurement interval required for a voltage level of the measurement voltage transient to reach a predetermined voltage threshold and a reference interval required for a voltage level of the reference voltage transient to reach the predetermined voltage threshold, and to provide second control signals to a second functional module within the integrated circuit, the second control signals representing the one of the settings corresponding to a value of the result, wherein each of a second group of the settings is represented by a different value of the result, wherein the second functional module implements the one of the settings represented by the second control signals.

Particular implementations can include one or more of the following features. Implementations can comprise a comparator to determine a polarity of the difference voltage, wherein the first control signals include a polarity signal representing the polarity of the difference voltage. Implementations can comprise a crossing network to swap connections between the current mirror and the measurement and reference terminals in response to the polarity signal, thereby ensuring that the difference voltage is positive when quantizing the difference voltage. The second analog-to-digital converter quantizes a ratio of the measurement interval and the reference interval, thereby producing the result. Implementations can comprise a measurement switch to discharge the external measurement capacitor before applying the second direct current to the external measurement capacitor; and a reference switch to discharge the external reference capacitor before applying the second direct current to the external reference capacitor. The integrated circuit is a switching voltage regulator; and the functions comprise at least one of selectable switching frequency, selectable set point, selectable droop level, and selectable digital compensation mode.

In general, in one aspect, the invention features a method and apparatus for determining settings specified from a plurality of the settings for functions provided in an integrated circuit, wherein the settings are specified by connecting an external capacitor to a terminal of the integrated circuit and connecting an external resistor between the terminal and a common terminal of the integrated circuit. It comprises a first current source to apply a first direct current to the terminal of the integrated circuit while the common terminal is connected to a predetermined voltage, thereby producing a voltage at the terminal; a first analog-to-digital converter to quantize a voltage level of the voltage, thereby producing a quantized voltage, and to provide first control signals to a first functional module within the integrated circuit, the first control signals representing the one of the settings corresponding to the quantized voltage, wherein each of a first group of the settings is represented by a different quantized voltage; wherein the first functional module implements the one of the settings represented by the first control signals; a second current source to provide a second direct current to the terminal while the common terminal is not connected to the predetermined voltage, thereby producing a voltage transient; and a second analog-to-digital converter to quantize a interval required for a voltage level of the voltage transient to reach a predetermined voltage threshold, and to provide second control signals to a second functional module within the integrated circuit, the second control signals representing the one of the settings corresponding to a value of the quantized interval, wherein each of a second group of the settings is represented by a different quantized interval, wherein the second functional module implements the one of the settings represented by the second control signals.

Advantages that can be seen in implementations of the invention include one or more of the following. Implementations of the invention minimize the number of terminals required to specify a given number of functional settings for an integrated circuit, for example allowing a designer to select several functional settings for an integrated circuit using a single terminal of the integrated circuit.

The details of one or more implementations are set forth in the accompanying drawings and the description below.

Other features will be apparent from the description and drawings, and from the claims.

Figure 1:
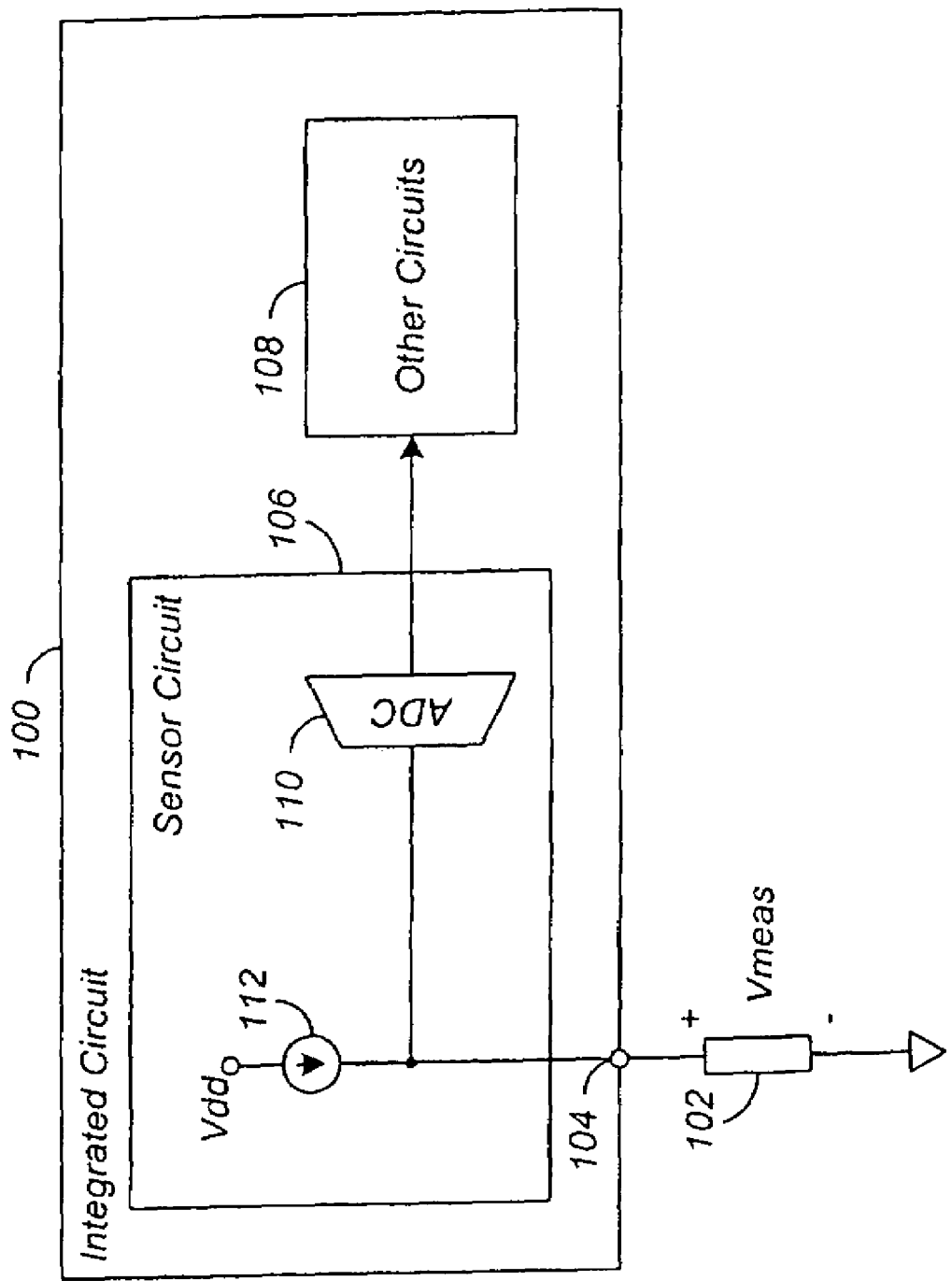
FIG. 1 depicts an integrated circuit that provides a function having a user-selectable setting, according to one implementation.

The leading digit(s) of each reference numeral used in this specification indicates the number of the drawing in which the reference numeral first appears.

DETAILED DESCRIPTION

FIG. 1 depicts an integrated circuit 100 that provides a function having a user-selectable setting, according to one implementation. A user selects a setting by connecting an external element 102 to a terminal 104 of integrated circuit 100. The external element can be a resistor, a capacitor, an inductor, or the like, or any combination thereof. A sensor circuit 106 detects a value, such as an impedance, of the external element and determines the setting corresponding to the value of the element, where each setting is represented by a different value. Sensor circuit 106 then sends one or more control signals representing the selected setting to other circuits 108 in the integrated circuit 100. The other circuits then implement the selected setting.

In one implementation, sensor circuit 106 includes a current source 112 that provides a predetermined level of current to terminal 104, thereby producing a voltage Vmeas at terminal 104. In one implementation, voltage Vmeas is substantially constant throughout the measurement. According to that implementation, an analog-to-digital converter (ADC) 110 measures the voltage level of voltage Vmeas, and generates control signals representing the selected setting, where each setting is represented by a different voltage level of voltage Vmeas. In particular, ADC 110 converts the analog voltage measurement to a digital value comprising one or more bits, each represented by a control signal having one of two values, as is well-known in the relevant arts.

In another implementation, voltage Vmeas varies during the measurement. According to that implementation, analog-to-digital converter ADC 110 measures the interval required for the voltage level of voltage Vmeas to reach a predetermined reference voltage, and generates control signals representing the selected setting, where each setting is represented by a different interval. In particular, ADC 110 converts the measurement of the interval to a digital value comprising one or more bits, each represented by a control signal having one of two values, as is well-known in the relevant arts. Each setting is represented by a different digital value. The control signals representing the digital value are fed to other circuits 108 within integrated circuit 100, which implement the selected setting.

Figure 2:
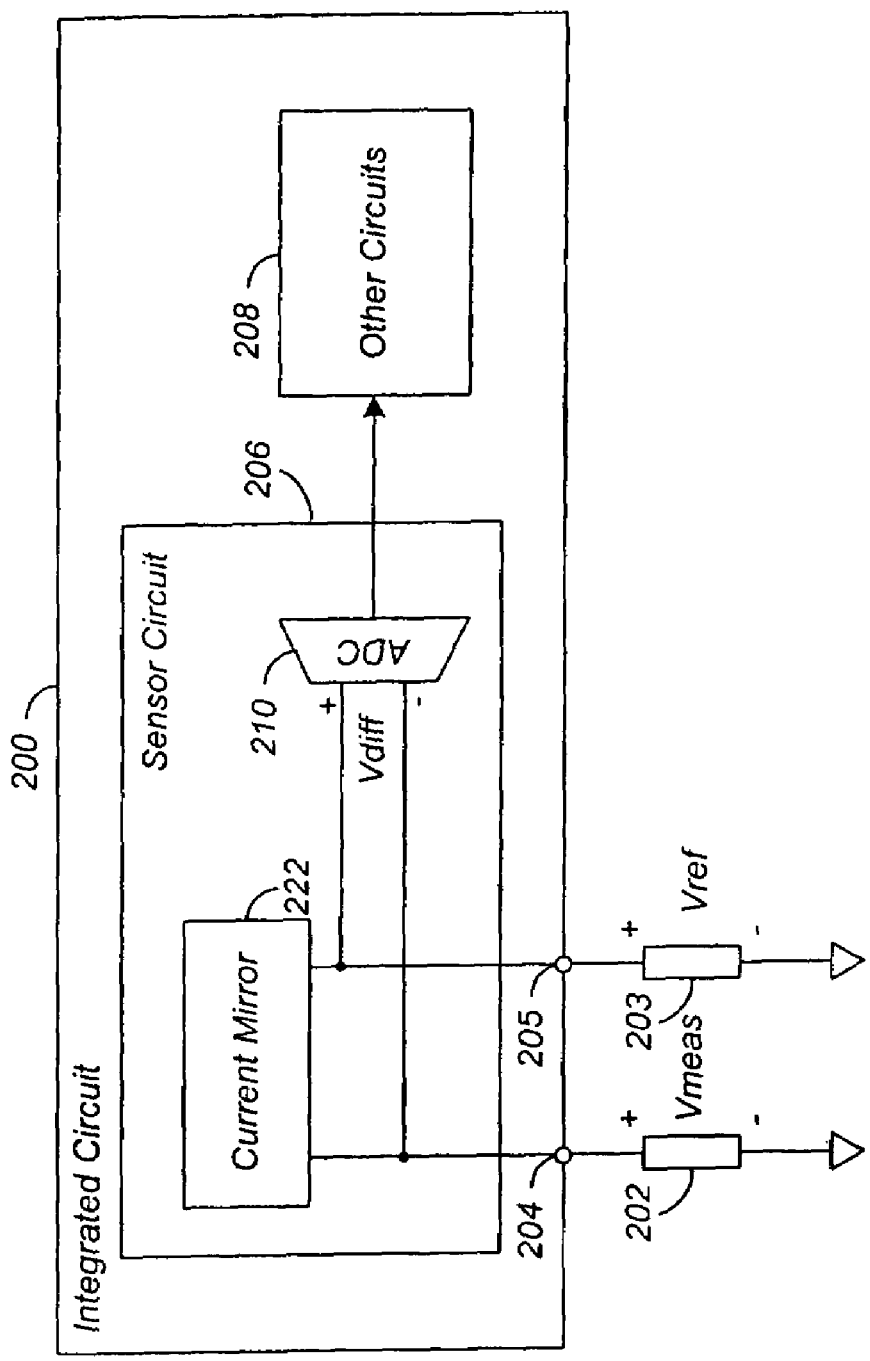
FIG. 2 depicts an integrated circuit that provides a function having a user-selectable setting and an external reference element, according to one implementation.

FIG. 2 depicts an integrated circuit 200 that provides a function having multiple user-selectable settings, according to another implementation. A user selects a setting by connecting a measurement element 202 externally to a measurement terminal 204 of integrated circuit 200. The external element can be a resistor, a capacitor, an inductor, or the like, or any combination thereof. A measurement of the value of an external element such as measurement element 202 is generally made against a reference element, as is well-known in the relevant arts. In general, the values of reference elements created internally to an integrated circuit are less accurate than the values of similar external reference elements, unless considerable time and expense are incurred. Therefore in the implementation of FIG. 2, a reference element 203, of the same type as measurement element 202, is connected externally to a reference terminal 205 of integrated circuit 200. A sensor circuit 206 then detects a combined value that is a function of the values of measurement element 202 and reference element 203, such as a difference, ratio, or the like, where each setting is represented by a different combined value. Sensor circuit 206 then sends control signals representing the selected setting to other circuits 208 in the integrated circuit 200, which implement the selected setting.

In one implementation, sensor circuit 206 includes a current mirror 222 that provides a predetermined level of current to terminal 204, thereby producing a voltage Vmeas at terminal 204. Current mirror 222 also provides the same predetermined level of current to terminal 205, thereby producing a voltage Vref at terminal 205. In one implementation, voltages Vmeas and Vref are substantially constant throughout the measurement. According to that implementation, an analog-to-digital converter (ADC) 210 measures a difference voltage Vdiff between the voltage level of voltage Vmeas and the voltage level of voltage Vref and generates control signals representing the selected setting, where each setting is represented by a different voltage level of the difference voltage Vdiff. In particular, ADC 210 converts the analog voltage measurement to a digital value comprising one or more bits, each represented by a control signal having one of two values, as is well-known in the relevant arts.

In another implementation, voltages Vmeas and Vref vary during the measurement. According to that implementation, ADC 210 measures the intervals required for the voltage levels of each of voltages Vmeas and Vref to reach a predetermined reference voltage, and generates a result of a function of the intervals. In one implementation, ADC 210 generates a ratio of the intervals. ADC 210 then generates control signals representing the selected setting, where each setting is represented by a different ratio. In particular, ADC 210 converts the ratio to a digital value comprising one or more bits, each represented by a control signal having one of two values, as is well-known in the relevant arts. Each setting is represented by a different digital value. The control signals representing the digital value are fed to other circuits 208 within the integrated circuit, which implement the selected setting.

Figure 3:
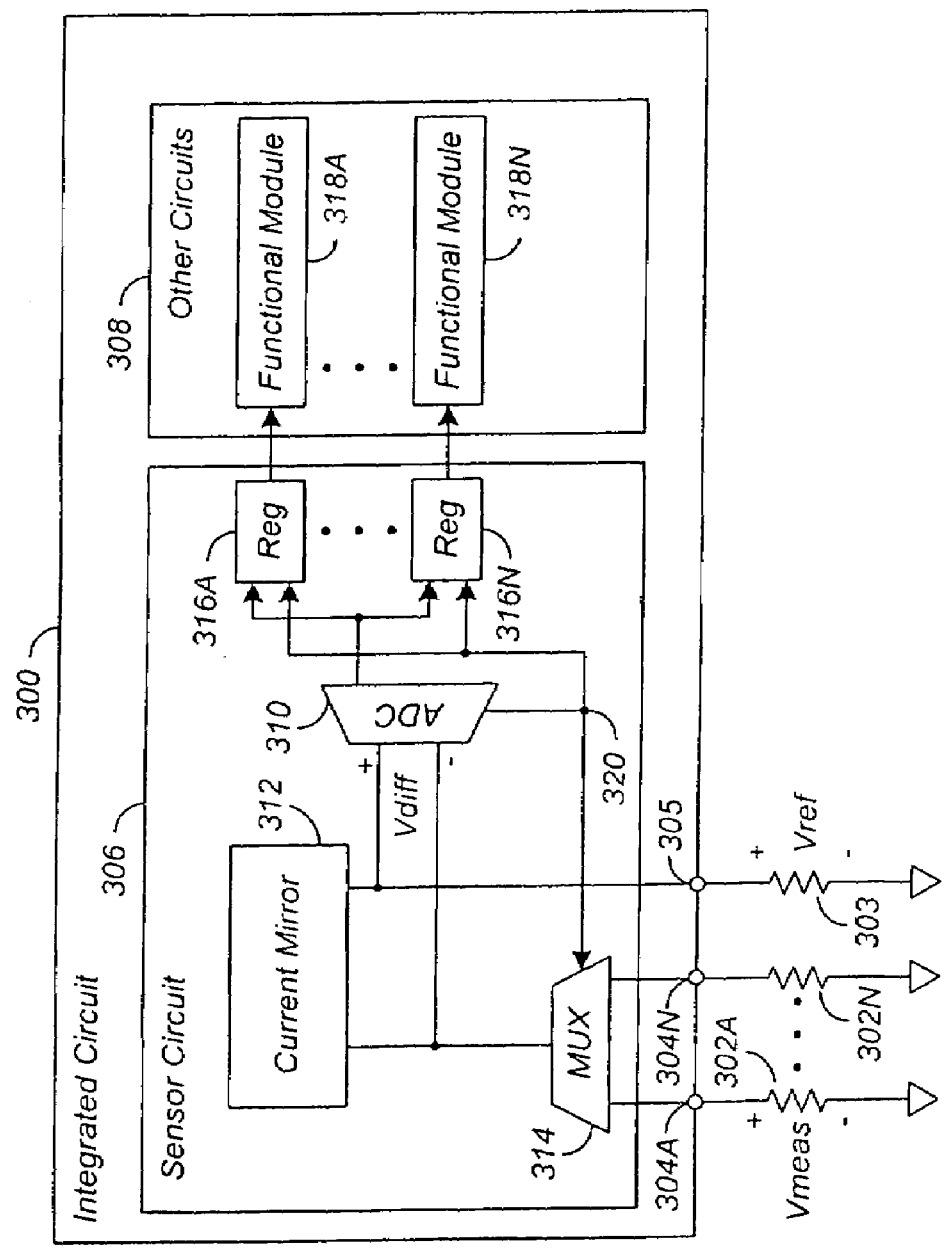
FIG. 3 depicts an integrated circuit that provides a plurality of functions, each having multiple settings that can be selected by connecting external resistors to the integrated circuit, according to one implementation.

FIG. 3 depicts an integrated circuit 300 that provides a plurality of functions, each having multiple settings that can be selected by connecting external resistors to the integrated circuit, according to one implementation. A user selects a setting for a function by selecting a measurement resistor 302 having a resistance corresponding to the setting, where each setting is represented by a different resistance. The user then connects the measurement resistor 302 externally to a measurement terminal 304 of integrated circuit 300 that corresponds to the function. A measurement of the value of an external element such as measurement resistor 302 is generally made against a reference element, as is well-known in the relevant arts. In general, the values of reference elements created internally to an integrated circuit are less accurate than the values of similar external reference elements, unless considerable time and expense are incurred. Therefore in the implementation of FIG. 3, a reference resistor 303 is connected externally to a reference terminal 305 of integrated circuit 300. A sensor circuit 306 then detects the resistances of measurement resistors 302 relative to reference resistor 303, where each setting is represented by a different resistance, and generates control signals based on the detected resistances. Sensor circuit 306 then sends the control signals, which represent the selected settings, to other circuits 308 in the integrated circuit 300, which implement the selected settings.

Figure 4:
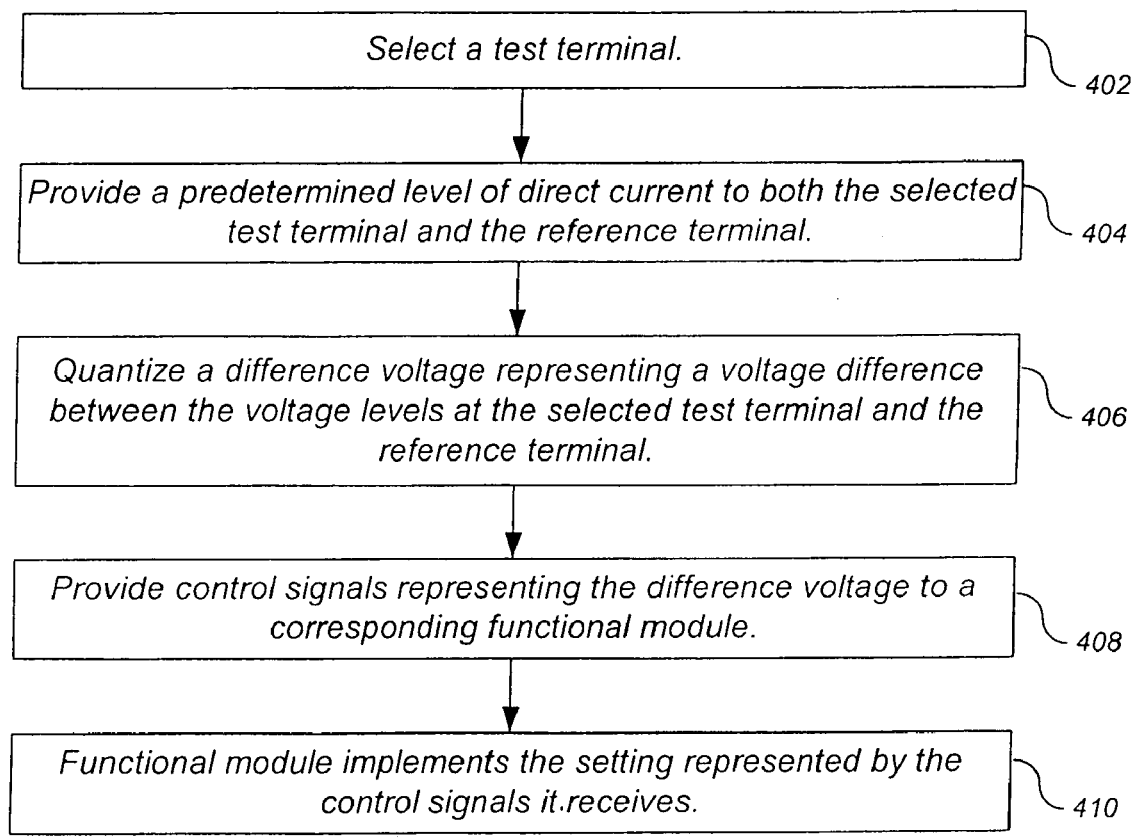
FIG. 4 shows an operation of the sensor circuit of FIG. 3 according to one implementation.

FIG. 4 shows an operation of sensor circuit 306 according to one implementation. In this implementation, sensor circuit 306 detects the resistances by generating a voltage across the measurement and reference resistors, and measuring the difference between the voltages. An analog-to-digital converter (ADC) 310 selects one of the functions, and asserts a corresponding select signal at node 320, thereby causing a multiplexer 314 to select the one of measurement terminals 304A through 304N (step 402) reserved for that function. A current mirror 312 then provides a predetermined level of direct current to both the selected measurement terminal 304 and reference terminal 305, thereby producing a voltage Vmeas at the measurement terminal and a voltage Vref at the reference terminal (step 404). In other implementations, current mirror 312 provides a time-varying current.

ADC 310 quantizes a difference voltage Vdiff representing a voltage difference between the voltage level of voltage Vmeas and the voltage level of voltage Vref (step 406), thereby producing a quantized voltage. In particular, ADC 310 converts the analog voltage measurement to a digital value comprising one or more bits, as is well-known in the relevant arts. Each setting for the selected function is represented by a different quantized voltage value.

Sensor circuit 306 includes a plurality of registers 316, one for each of the functions having selectable settings. The select signal asserted by ADC 310 causes the output of ADC 310 to be latched into the register 316 for the function selected by ADC 310. Each register provides its contents as control signals to a corresponding functional module 318 within other circuits 308 within integrated circuit 300 (step 408). Each functional module implements the setting represented by the control signals it receives (step 410).

In other implementations, registers 316 are located within other circuits 308, and sensor circuit 306 provides the select signal and ADC outputs to other circuits 308. In some implementations integrated circuit 300 provides only one function, so only one measurement resistor is needed to select the settings provided by that function. In those implementations, ADC 310 does not generate a select signal, and multiplexer 314 is not needed.

Figure 5:
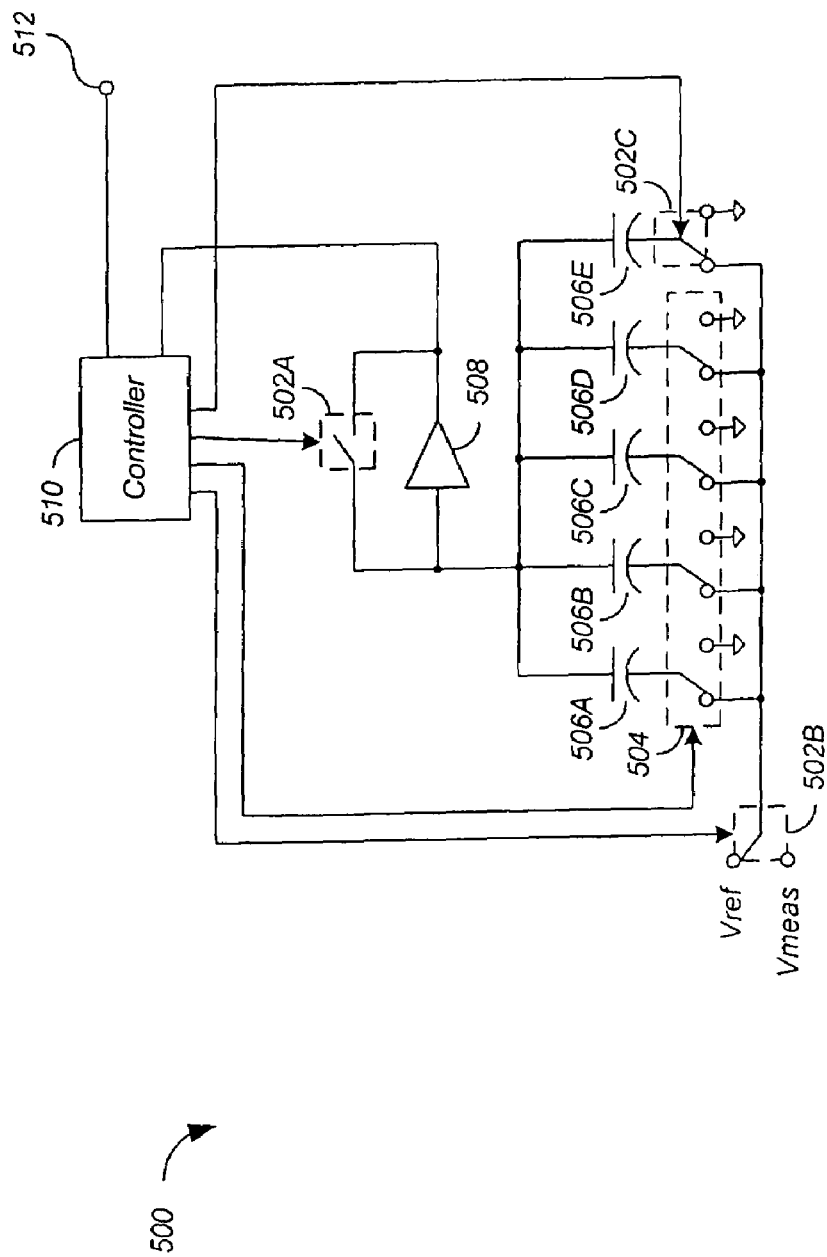
FIG. 5 depicts a charge redistribution analog-to-digital converter (ADC) that can function as the ADC of FIG. 3.

FIG. 5 depicts a charge redistribution analog-to-digital converter (ADC) 500 that can function as ADC 310 in integrated circuit 300. ADC 500 includes switches 502A, 502B, and 502C, a switch bank 504, capacitors 506A through 506E, an amplifier 508, and an ADC controller 510. Capacitors 506A through 506D form a binary-weighted switched capacitor array. Capacitor 506A has a capacitance 8C; capacitor 506B has a capacitance 4C, capacitor 506C has a capacitance 2C, and capacitors 506D and 506E each have a capacitance C, where C is some arbitrary capacitance.

During an autozero phase of operation, controller 510 closes switch 502A and connects switch 502B, 502C and 504 to Vmeas. Then controller 510 opens switch 502A, and a short time later connects switches 502C and 504 to ground, thereby capacitively discharging the input to amplifier 508 by Vmeas volts. During a trial phase of operation, controller 510 connects switch 502B to Vref, and a short time later independently manipulates the switches within switch bank 504, thereby injecting different fractions of voltage Vref into amplifier 508, until the output voltage of amplifier 508 is brought back to its autozero value. The settings of the switches in switch bank 504 that bring the output of amplifier 508 back to its autozero value represent the output of ADC 510. This output is available at terminal 512.

Figure 6:
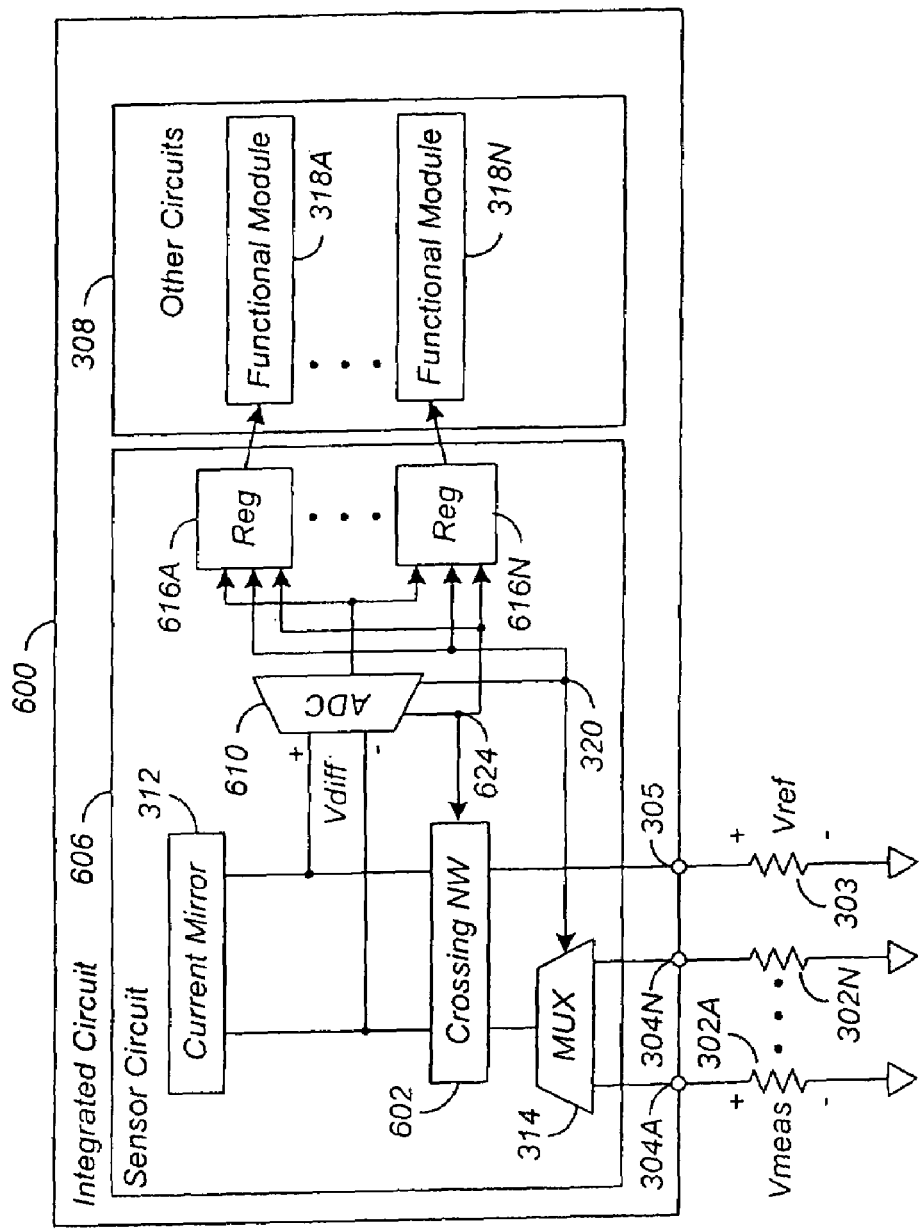
FIG. 6 depicts an integrated circuit that provides a plurality of functions, each having multiple settings that can be selected by connecting external resistors to the integrated circuit, according to an implementation that measures the polarity of the difference voltage Vdiff.

FIG. 6 depicts an integrated circuit 600 that provides a plurality of functions, each having multiple settings that can be selected by connecting external resistors to the integrated circuit, according to an implementation that measures the polarity of the difference voltage Vdiff. Integrated circuit 600 includes a sensor circuit 606 that operates in a manner similar to that described above for sensor circuit 306 with reference to FIG. 3. However, because ADC 310 of sensor circuit 306 can accept only positive values of voltage Vdiff, the values of resistance that can be chosen for resistor 302 are limited. In particular, the resistance of resistor 302 must be less that the resistance of resistor 303.

In some implementations, the ADC uses one of the measured voltage Vmeas and the reference voltage Vref to define the full-scale output of the ADC. Therefore, sensor circuit 606 includes a conventional crossing network 602 to ensure that the voltage Vdiff presented to ADC 610 is positive when ADC 610 is quantizing voltage Vdiff. Referring again to FIG. 6, ADC 610 includes a comparator that determines a polarity of voltage Vdiff. ADC 610 provides at a node 624 a polarity signal representing the polarity of voltage Vdiff to registers 616, which provide the polarity signal as part of the control signals provided to functional modules 318, thereby doubling the range of possible control signals, and therefore the range of possible settings.

The polarity signal also controls crossing network 602. When the polarity of voltage Vdiff is negative, the polarity signal causes crossing network 602 to swap the connections between current mirror 312, the measurement resistors 302, and the reference resistor 303.

Figure 7:
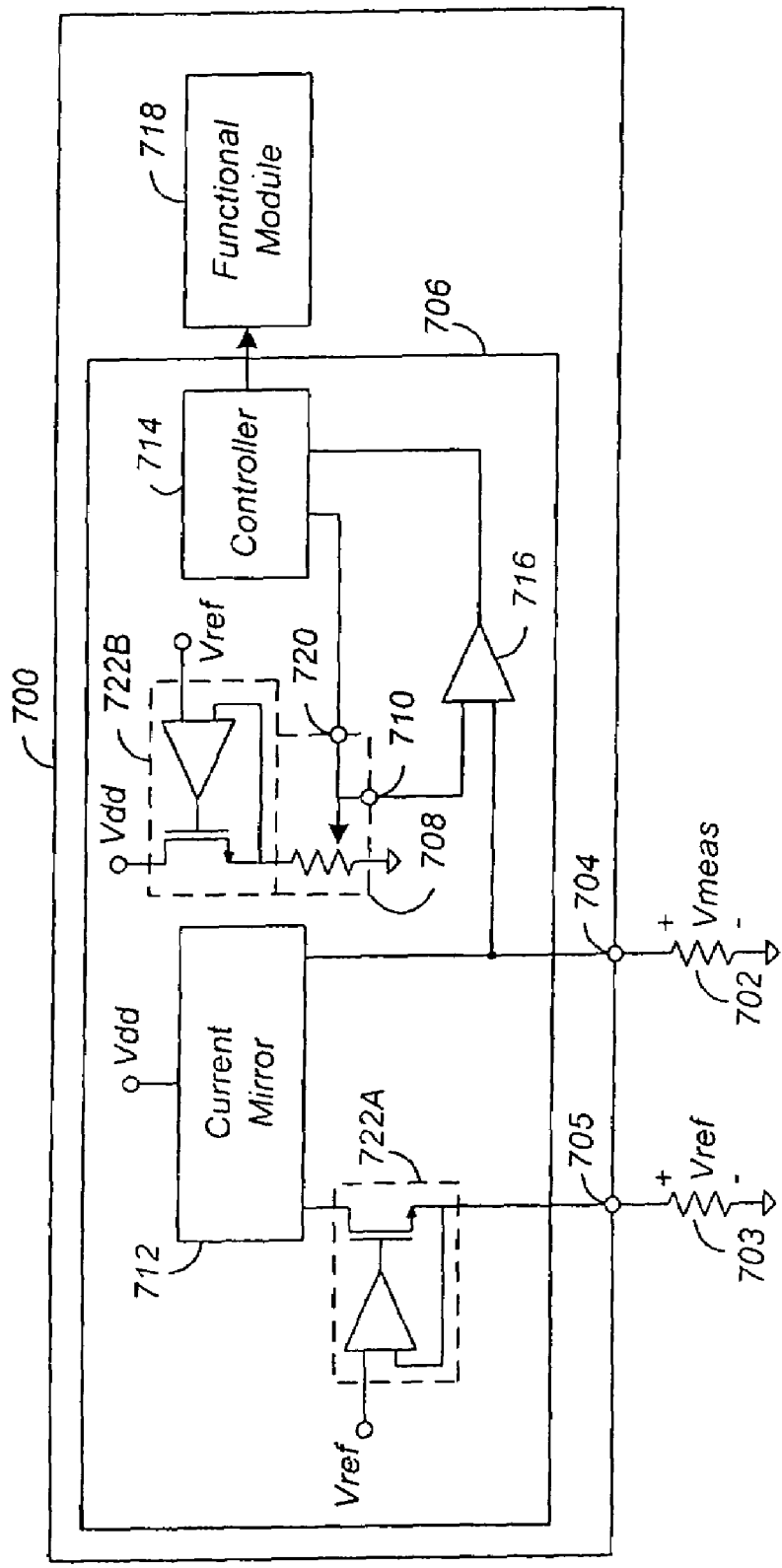
FIG. 7 depicts an integrated circuit that provides a function having multiple settings that can be selected by connecting an external resistor to the integrated circuit, according to an implementation using a resistor with a variable resistance tap.

FIG. 7 depicts an integrated circuit 700 that provides a function having multiple settings that can be selected by connecting an external resistor to the integrated circuit, according to an implementation using a resistor with a variable resistance tap. A user selects a setting for a function by selecting a measurement resistor 702 having a resistance corresponding to the setting, where each setting is represented by a different resistance. The user then connects measurement resistor 702 externally to a measurement terminal 704 of integrated circuit 700 that corresponds to the function. A measurement of the value of an external element such as measurement resistor 702 is generally made against a reference element, as is well-known in the relevant arts. In general, the values of reference elements created internally to an integrated circuit are less accurate than the values of similar external reference elements, unless considerable time and expense are incurred. Therefore in the implementation of FIG. 7, an external reference resistor 703 is connected to a reference terminal 705 of integrated circuit 700. A sensor circuit 706 then detects the resistance of measurement resistor 702 relative to reference resistor 703, where each setting is represented by a different resistance. Sensor circuit 706 then sends control signals representing the selected setting to functional module 718 in the integrated circuit 700, which implement the selected setting.

In this implementation, sensor circuit 706 detects the resistances by generating a voltage across the measurement and reference resistors, and measuring the difference between the voltages. A voltage reference 722A imposes a voltage Vref across reference resistor 703 having a resistance Rref, thereby generating a direct current I given by $$I = \frac{Vref}{Rref} \tag{1}$$

at reference terminal 705. A current mirror 712 then provides the same direct current I to measurement terminal 704, thereby producing a voltage Vmeas given by $$Vmeas = Vref \frac{Rtest}{Rref} \tag{2}$$

at measurement terminal 704, where the resistance of measurement resistor 702 is Rmeas. In other implementations, current mirror 712 provides a time-varying current.

A second voltage reference 722B imposes the same voltage Vref across a resistor 708 having a variable resistance tap 710 and a control input 720. A controller 714 uses control input 720 to select successive equally-spaced fractions of the resistance of resistor 708, thereby causing successive equally-spaced fractions of voltage Vref to appear at tap 710. A comparator 716 compares these equally-spaced fractions of voltage Vref to voltage Vmeas, and provides the comparison output to controller 714.

When successive fractions of voltage Vref yield different outputs of comparator 716, controller 714 provides a digital control signal to functional module 718 representing one of the successive fractions of voltage Vref, where each setting of the function is represented by one of the fractions. Functional module 718 implements the setting represented by the digital control signal. Although the implementation of FIG. 7 provides only one function with user-selectable settings, other implementations accommodate multiple such functions by using techniques such as the multiplexer scheme shown in FIG. 3.

Figure 8:
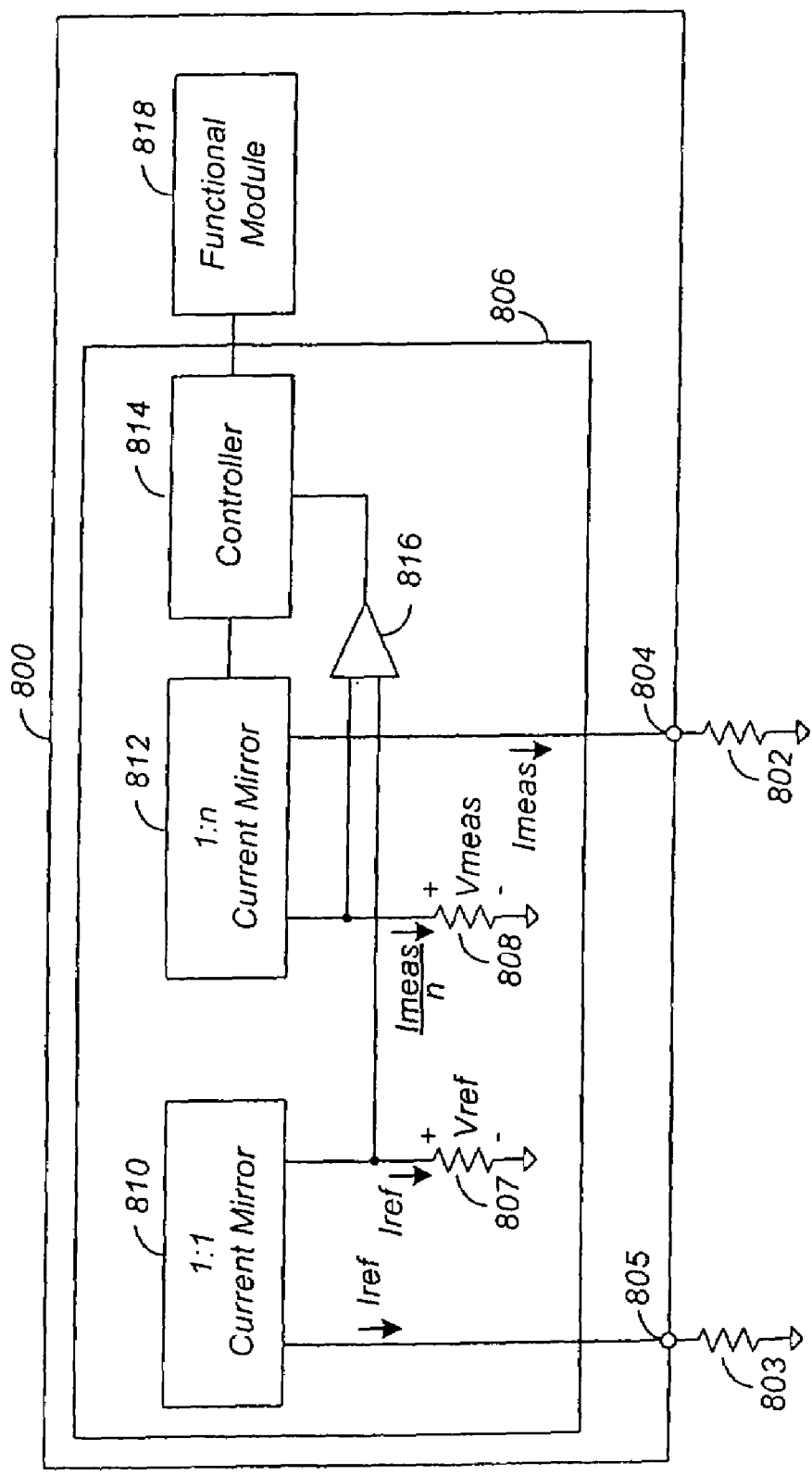
FIG. 8 depicts an integrated circuit that provides a function having multiple settings that can be selected by connecting an external resistor to the integrated circuit, according to an implementation using an adjustable current mirror.

FIG. 8 depicts an integrated circuit 800 that provides a function having multiple settings that can be selected by connecting an external resistor to the integrated circuit, according to an implementation using an adjustable current mirror. A user selects a setting for a function by selecting a measurement resistor 802 having a resistance corresponding to the setting, where each setting is represented by a different resistance. The user then connects measurement resistor 802 externally to a measurement terminal 804 of integrated circuit 800 that corresponds to the function. A measurement of the value of an external element such as measurement resistor 802 is generally made against a reference element, as is well-known in the relevant arts. In general, the values of reference elements created internally to an integrated circuit are less accurate than the values of similar external reference elements, unless considerable time and expense are incurred. Therefore in the implementation of FIG. 8, an external reference resistor 803 is connected to a reference terminal 805 of integrated circuit 800. A sensor circuit 806 then detects a ratio of the resistances of measurement resistor 802 reference resistor 803, where each setting is represented by a different ratio. Sensor circuit 806 then sends control signals representing the selected setting to functional module 818 in the integrated circuit 800, which implements the selected setting.

Integrated circuit 800 includes a pair of matched current mirrors 810 and 812. Current mirror 810 is a fixed 1:1 current mirror that is biased by an external reference resistor 803 connected to a reference terminal 805 of integrated circuit 800. A current Iref develops across reference resistor 803. Therefore current mirror 810 forces current Iref over an internal resistor 807, producing a voltage Vref Current mirror 812 is an adjustable 1:n current mirror that is biased by an external measurement resistor 802 connected to a measurement terminal 804 of integrated circuit 800. A current Imeas develops across measurement resistor 802. Therefore current mirror 812 forces a current Imeas/n over an internal resistor 808 having the same resistance as resistor 807, producing a voltage Vmeas.

A comparator 816 compares the voltages Vref and Vmeas, and provides an output to a controller 814. Controller 814 applies successive digital inputs n to variable current mirror 812, thereby generating corresponding measurement voltages Vmeas. When successive digital inputs to variable current mirror 812 yield different outputs of comparator 816, controller 814 provides one of the successive digital inputs as control signals to a functional module 818. Functional module 818 implements the setting represented by the control signals. Although the implementation of FIG. 8 provides only one function with user-selectable settings, other implementations accommodate multiple such functions by using techniques such as the multiplexer scheme shown in FIG. 3. Although FIG. 8 depicts a voltage comparison, other implementations use a direct current comparison, for example, by establishing opposing current sources that are periodically reset to an initial state.

Figure 9:
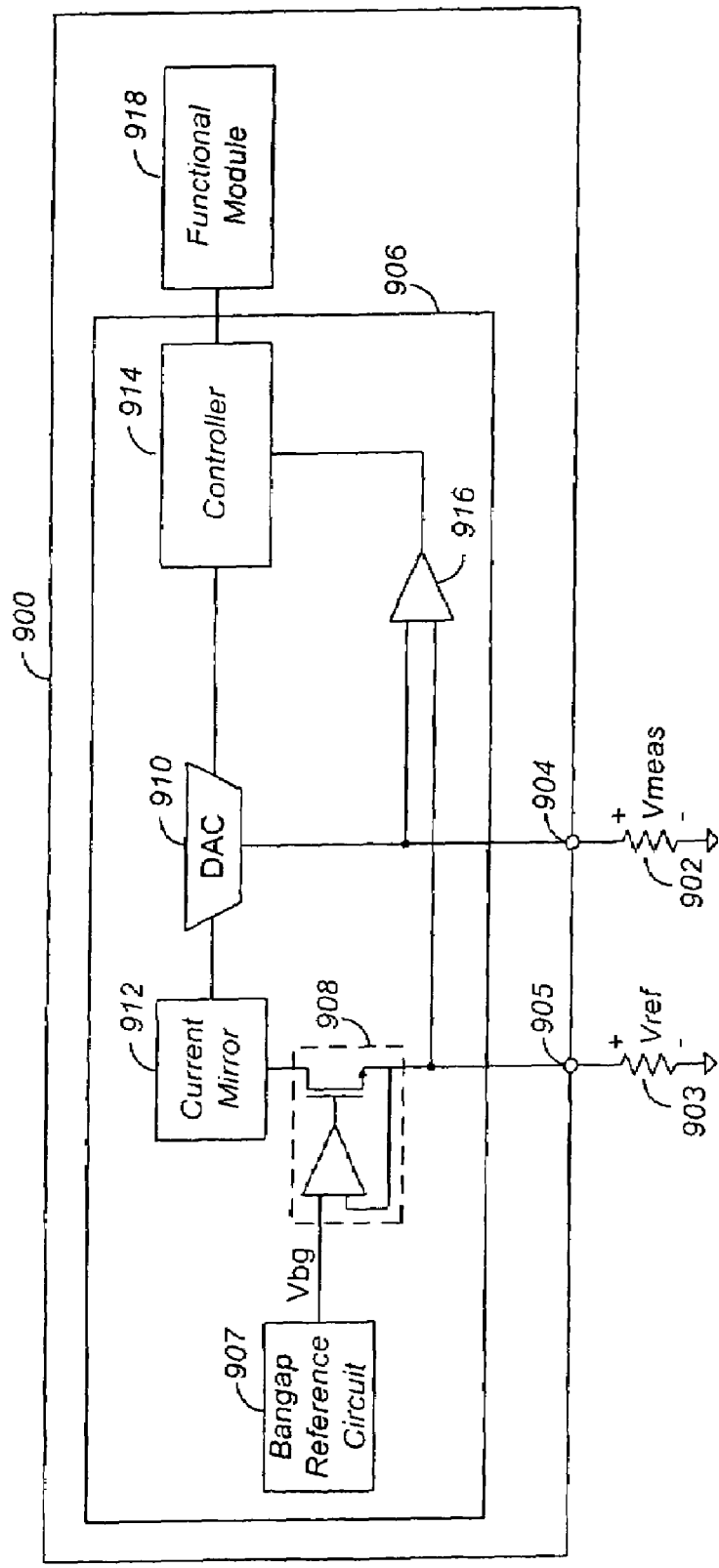
FIG. 9 depicts an integrated circuit that provides a function having multiple settings that can be selected by connecting an external resistor to the integrated circuit, according to an implementation using a digital-to-analog converter (DAC) with a current output.

FIG. 9 depicts an integrated circuit 900 that provides a function having multiple settings that can be selected by connecting an external resistor to the integrated circuit, according to an implementation using a digital-to-analog converter (DAC) with a current output.

A user selects a setting for a function by selecting a measurement resistor 902 having a resistance corresponding to the setting, where each setting is represented by a different resistance. The user then connects measurement resistor 902 externally to a measurement terminal 904 of integrated circuit 900 that corresponds to the function. A measurement of the value of an external element such as measurement resistor 902 is generally made against a reference element, as is well-known in the relevant arts. In general, the values of reference elements created internally to an integrated circuit are less accurate than the values of similar external reference elements, unless considerable time and expense are incurred. Therefore in the implementation of FIG. 9, an external reference resistor 903 is connected to a reference terminal 905 of integrated circuit 900. A sensor circuit 906 then detects the ratio of the resistances of measurement resistor 902 reference resistor 903, where each setting is represented by a different ratio. Sensor circuit 906 then sends control signals representing the selected setting to functional module 918 in the integrated circuit 900, which implements the selected setting.

A conventional bandgap reference circuit 907 provides a bandgap voltage Vbg that is accurate to within the tolerances of the measurement and reference resistors. A voltage reference circuit 908 applies the bandgap voltage Vbg to a reference terminal 905 having an external reference resistor 903 connected thereto, thereby producing a reference voltage Vref at reference terminal 905, and generating a reference current Iref given by $$Iref = \frac{Vbg}{Rref} \qquad (3)$$

where Rref is the resistance of resistor 903. A current mirror 912 provides reference current Iref to DAC 910. A controller 914 applies successive digital inputs to DAC 910, which generates corresponding successive measurement voltages Vmeas across external measurement resistor 902. A comparator 916 compares each measurement voltage Vmeas with the reference voltage Vref. When successive digital inputs to DAC 910 yield different outputs of comparator 916, controller 914 provides one of the successive digital inputs as control signals to a functional module 918. Functional module 918 implements the setting represented by the control signals. Although the implementation of FIG. 9 provides only one function with user-selectable settings, other implementations accommodate multiple such functions by using techniques such as the multiplexer scheme shown in FIG. 3.

Figure 10:
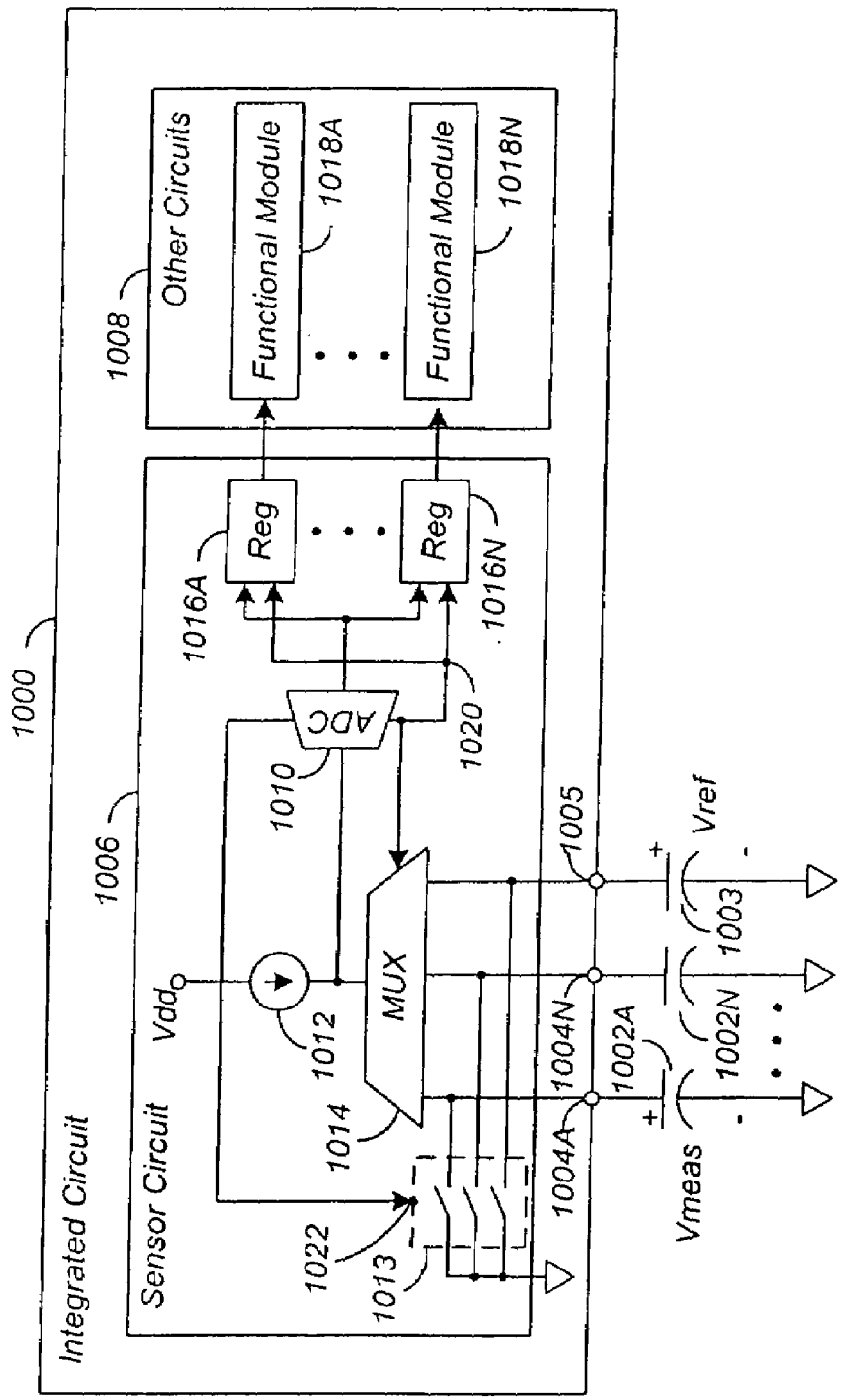
FIG. 10 depicts an integrated circuit that provides a plurality of functions, each having multiple settings that can be selected by connecting external capacitors to the integrated circuit, according to one implementation.

FIG. 10 depicts an integrated circuit 1000 that provides a plurality of functions, each having multiple settings that can be selected by connecting external capacitors to the integrated circuit, according to one implementation. A user selects a setting for a function by selecting a measurement capacitor 1002 having a capacitance corresponding to the setting, where each setting is represented by a different capacitance. The user then connects measurement capacitor 1002 externally to a measurement terminal 1004 of integrated circuit 1000 that corresponds to the function. A measurement of the value of an external element such as measurement capacitor 1002 is generally made against a reference element, as is well-known in the relevant arts. In general, the values of reference elements created internally to an integrated circuit are less accurate than the values of similar external reference elements, unless considerable time and expense are incurred. Another uncertainty is the clock frequency used to measure intervals within integrated circuit 1000. Therefore in the implementation of FIG. 10, a reference capacitor 1003 is connected externally to a reference terminal 1005 of integrated circuit 1000. A sensor circuit 1006 then detects the capacitances of measurement capacitors 1002 relative to reference capacitor 1003, where each setting is represented by a different capacitance, and generates control signals based on the detected capacitances. Sensor circuit 1006 then sends the control signals, which represent the selected settings, to other circuits 1008 in the integrated circuit 1000, which implement the selected settings.

Figure 11:
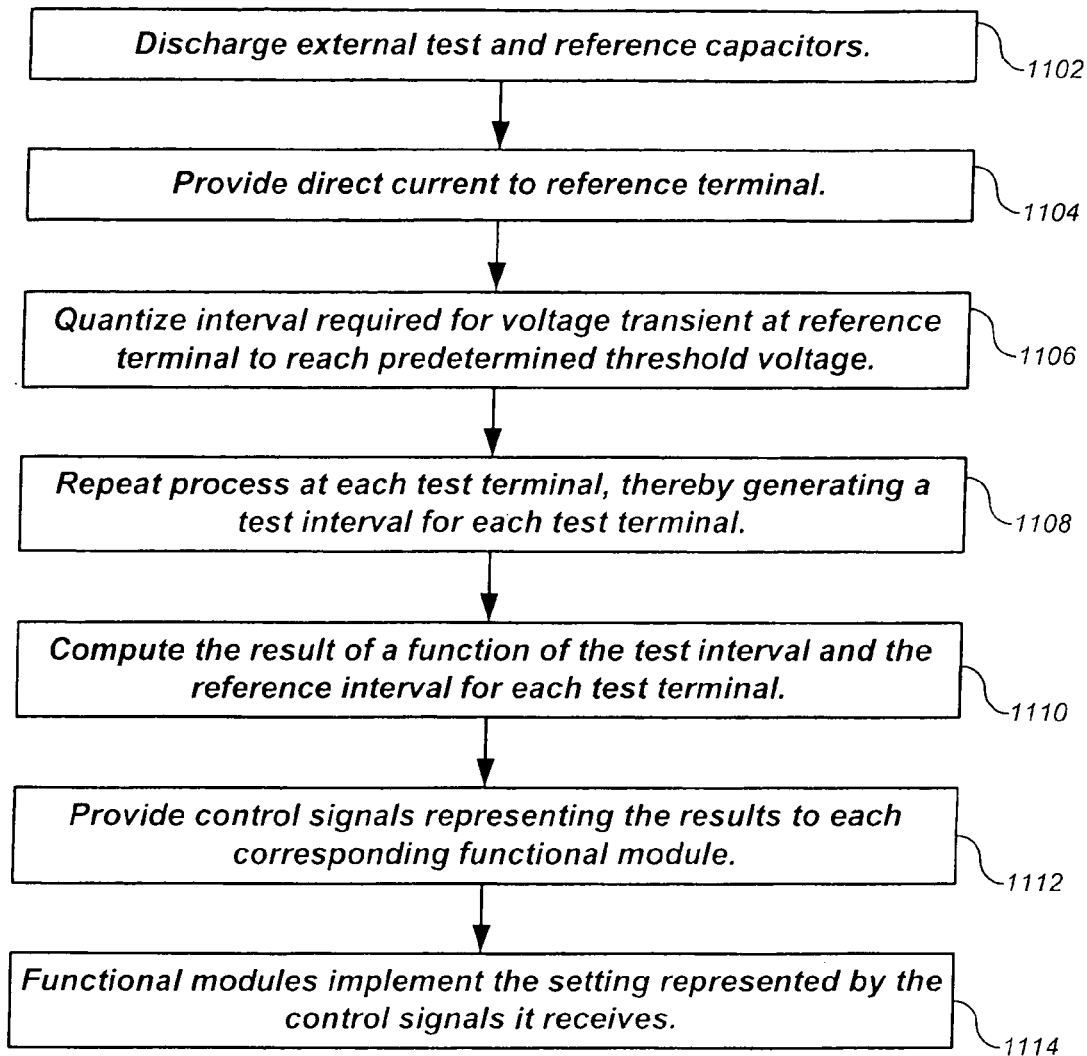
FIG. 11 shows an operation of the sensor circuit of FIG. 10 according to one implementation.

FIG. 11 shows an operation of sensor circuit 1006 according to one implementation. In this implementation, sensor circuit 1006 detects the capacitances by generating a voltage transient across the measurement and reference capacitors, and measuring the intervals required for the voltage transients to reach a predetermined voltage threshold. A current source 1012 generates a direct current. An analog-to-digital converter (ADC) 1010 first asserts a discharge signal at node 1022 that causes a switch 1013 to first close, thereby discharging all of the external capacitors 1002 and 1003 (step 1102), and then open again. ADC 1010 then asserts a select signal at node 1020 that causes a multiplexer 1014 to provide the direct current to reference terminal 1005 (step 1104), thereby producing a reference voltage transient at reference terminal 1005. ADC 1010 quantizes an interval required for the reference voltage transient to reach the predetermined threshold voltage (step 1106), thereby producing a quantized reference interval. ADC 1010 then repeats the process for each of the measurement capacitors 1002 (step 1108), thereby producing a quantized measurement interval for each measurement capacitor.

For each measurement interval, ADC 1010 then computes the result of a function of that measurement interval and the reference interval, thereby producing a result for each measurement capacitor (step 1110). Each setting for a function corresponding to a measurement capacitor is represented by a different value of the result for that measurement capacitor.

Sensor circuit 1006 includes a plurality of registers 1016, one for each of the functions having selectable settings. The select signal asserted by ADC 1010 causes the result of ADC 1010 to be latched into the register 1016 for the function selected by ADC 1010. Each register provides its contents as control signals to a corresponding functional module 1018 within the other circuits 1008 within integrated circuit 1000 (step 1112). Each functional module implements the setting represented by the control signals it receives (step 1114).

In some implementations integrated circuit 1000 provides only one function, so only one measurement capacitor is needed to select the settings provided by that function. In those implementations, ADC 1010 does not generate a select signal, and multiplexer 1014 is not needed.

Figure 12:
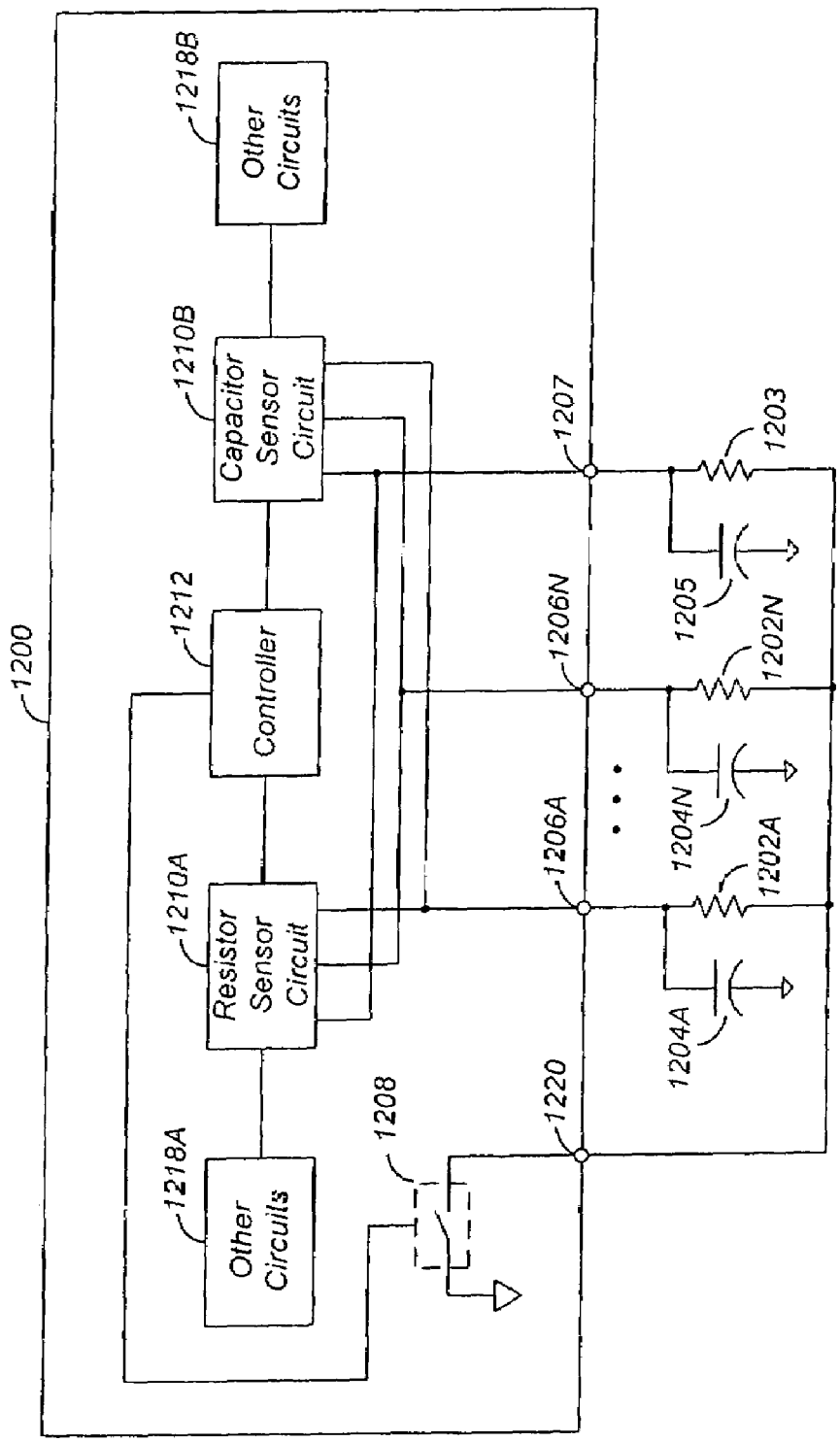
FIG. 12 depicts an integrated circuit that provides a plurality of functions, each having multiple settings that can be selected by connecting external resistors and capacitors to the integrated circuit, according to one implementation.

FIG. 12 depicts an integrated circuit 1200 that provides a plurality of functions, each having multiple settings that can be selected by connecting external resistors and capacitors to the integrated circuit, according to one implementation. A user selects a setting for a function by selecting a measurement resistor 1202 having a resistance corresponding to the setting, or by selecting a measurement capacitor 1204 having a capacitance corresponding to the setting, where each setting is represented by a different capacitance or resistance. For each function, the user then connects a measurement capacitor 1204 externally to a measurement terminal 1206 of integrated circuit 1200 that corresponds to the function, or connects a measurement resistor 1202 between a measurement terminal that corresponds to the function 1206 and a common terminal 1220.

A sensor circuit 1210A detects the resistance of each measurement resistor 1202 and determines the setting represented by the resistance, where each setting is represented by a different resistance. A sensor circuit 1210B detects the capacitance of each measurement capacitor 1204 and determines the setting represented by the capacitance, where each setting is represented by a different capacitance. A reference resistor 1203 is connected externally between a reference terminal 1207 and common terminal 1220, and a reference capacitor 1205 is connected externally to reference terminal 1207 of integrated circuit 1200. Sensor circuits 1210A and 1210B employ the reference elements to measure the values of the measurement elements, as described in detail above.

Figure 13:
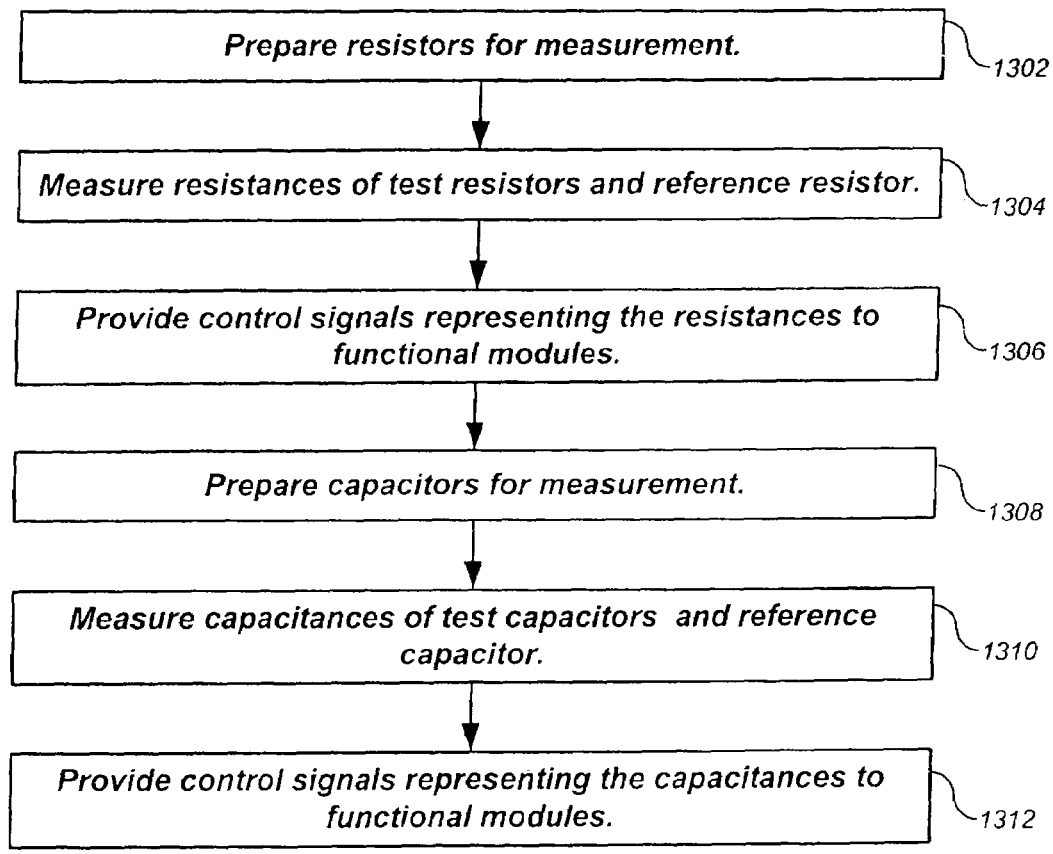
FIG. 13 shows an operation of the integrated circuit of FIG. 12 according to one implementation.

FIG. 13 shows an operation of integrated circuit 1200 according to one implementation. The resistances and capacitances are measured at different times, under the control of a controller 1212. Controller 1212 prepares the resistors for measurement by connecting common terminal 1220 to a predetermined voltage (step 1302). Referring to FIG. 12, controller 1212 causes a switch 1208 to connect common terminal 1220 to ground. A resistor sensor circuit 1210A then measures the resistances of measurement resistors 1202 and reference resistor 1203 (step 1304), and provides control signals representing the resistances to other circuits 1218A (step 1306) according to the methods described above. Other circuits 1218A implement the settings represented by the control signals.

Controller 1212 prepares the capacitors for measurement by disconnecting common terminal 1220 from the predetermined voltage. (step 1308). Referring to FIG. 12, controller 1212 causes switch 1208 to open-circuit common terminal 1220. A capacitor sensor circuit 1210B then measures the capacitances of measurement capacitors 1204 and reference capacitor 1205 (step 1310), and provides control signals representing the capacitances to other circuits 1218B (step 1312) according to the methods described above. Other circuits 1218B implement the settings represented by the control signals.

In some implementations integrated circuit 1200 provides only two functions, so only one measurement terminal, one measurement capacitor and one measurement resistor are needed to select the settings provided by that function.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. For example, while the described implementations realize a one-to-one relationship between external measurement elements and integrated circuit functions, other implementations realize one-to-many, many-to-one, and many-to-many relationships.

In some implementations, the integrated circuit is a switching voltage regulator, and the functional settings include switching frequency, set point, droop level, digital compensation mode, and the like. The set point is an adjustment to fine-tune the output voltage of the voltage regulator. The droop level is the change in the output voltage of the voltage regulator when going from a no-load condition to a full-load condition. The digital compensation mode setting is a selection of one of multiple methods to stabilize the feedback loop in the voltage regulator. Accordingly, other implementations are within the scope of the following claims.

What is claimed is:

1. A method for determining a setting specified from a plurality of settings for a function provided in an integrated circuit, the method comprising:
    connecting a measurement element to a terminal of an integrated circuit, the measurement element including at least one of a resistor, a capacitor, or an inductor;
    applying a direct current to the terminal of the integrated circuit and producing a voltage at the terminal;
    quantizing a voltage level of the voltage and producing a quantized voltage; and
    providing a control signal to a functional module within the integrated circuit, the control signal representing one of a plurality of settings that corresponds to the quantized voltage,
    wherein the functional module implements the one of the plurality of settings represented by the control signal.

2. The method of claim 1, further comprising:
    applying the direct current to a reference terminal of the integrated circuit and producing a reference voltage at the reference terminal, wherein the reference terminal is connected to a reference element, the reference element including at least one of a resistor, a capacitor, or an inductor; and
    wherein quantizing a voltage level of the voltage includes quantizing a voltage level of a difference voltage representing a voltage difference between the voltage and the reference voltage.

3. The method of claim 2, wherein quantizing a voltage level of a difference voltage includes determining a polarity of the difference voltage, and the method further includes:
    generating a polarity signal based on the determined polarity and using the polarity signal as an additional control signal for the functional module.

4. The method of claim 3, wherein:
    the integrated circuit is a switching voltage regulator; and
    the function includes at least one of selectable switching frequency, selectable set point, selectable droop level, and selectable digital compensation mode.

5. The method of claim 2, wherein the reference element is internal to the integrated circuit and the measurement element is external to the integrated circuit.

6. The method of claim 1, wherein producing a voltage at the terminal includes producing a measurement voltage transient, and producing a quantized voltage includes producing a quantized measurement interval by quantizing a measurement interval required for a voltage level of the measurement voltage transient to reach a predetermined voltage threshold, and the method further includes:
    applying the direct current to a reference terminal of the integrated circuit and producing a reference voltage transient at the reference terminal, wherein the reference terminal is connected to a reference element, the reference element including at least one of a resistor, a capacitor, or an inductor;
    producing a quantized reference interval by quantizing a reference interval required for a voltage level of the reference voltage transient to reach the predetermined voltage threshold; and
    generating a result of a function of the quantized measurement interval and the quantized reference interval,
    wherein the control signal provided to the functional module represents one of a plurality of settings that corresponds to a value of the result, each of the settings being represented by a different value of the result.

7. The method of claim 6, wherein generating a result of a function of the quantized measurement interval and the quantized reference interval includes determining a ratio of the quantized measurement interval and the quantized reference interval.

8. The method of claim 7, wherein the measurement element is an external measurement capacitor and the reference element is an external reference capacitor, and the method further includes:
    discharging the external measurement capacitor before applying the direct current to the external measurement capacitor; and
    discharging the external reference capacitor before applying the direct current to the external reference capacitor.

9. An apparatus for determining a setting specified from a plurality of settings for a function provided in an integrated circuit, the apparatus comprising:
    a measurement element connected to a terminal of an integrated circuit, the measurement element including at least one of a resistor, a capacitor, or an inductor;
    a current source operable to apply a direct current to the terminal of the integrated circuit and produce a voltage at the terminal; and
    an analog-to-digital converter to quantize a voltage level of the voltage and produce a quantized voltage, and to provide a control signal to a functional module within the integrated circuit, the control signal representing one of a plurality of settings that corresponds to the quantized voltage, wherein the functional module implements the one of the plurality of settings represented by the control signal.

10. The apparatus of claim 9, wherein:
the integrated circuit is a switching voltage regulator; and
the function includes at least one of selectable switching frequency, selectable set point, selectable droop level, and selectable digital compensation mode.

11. The apparatus of claim 10, wherein the measurement element is external to the integrated circuit.

12. The apparatus of claim 9, further comprising:
a multiplexer to apply the direct current to one of the terminal or a reference terminal of the integrated circuit in response to a select signal, the reference terminal being connected to a reference element, the reference element including at least one of a resistor, a capacitor, or an inductor, the multiplexer to produce a measurement voltage transient when the direct current is applied to the measurement terminal and a reference voltage transient when the direct current is applied to the reference terminal,
wherein the analog-to-digital converter provides the select signal, quantizes a result of a function of a measurement interval required for a voltage level of the measurement voltage transient to reach a predetermined voltage threshold,
wherein the control signal provided to the functional module represents one of a plurality of settings that corresponds to a value of the result, each of the settings being represented by a different value of the result.

13. The apparatus of claim 12, wherein the analog-to-digital converter quantizes the result by quantizing a ratio of the measurement interval and the reference interval.

14. The apparatus of claim 13, wherein the measurement element is an external measurement capacitor and the reference element is an external reference capacitor, and the apparatus further includes:
a measurement switch to discharge the external measurement capacitor before the direct current is applied to the external measurement capacitor; and
a reference switch to discharge the external reference capacitor before the direct current is applied to the external reference capacitor.

15. The apparatus of claim 9, wherein:
the current source includes a current mirror, and the current mirror is further operable to direct current to a reference terminal of the integrated circuit and produce a reference voltage at the reference terminal, the reference terminal, the reference terminal being connected to a reference element, the reference element including at least one of a resistor, a capacitor, or an inductor; and
the analog-to-digital converter is operable to quantize a difference voltage representing a difference voltage between the voltage at the terminal and the reference voltage and produce a quantized voltage.

16. The apparatus of claim 15, wherein the analog-to-digital converter includes a comparator to determine a polarity of the difference voltage, wherein the control signal includes a polarity signal representing the polarity of the difference voltage.

17. The apparatus of claim 16, further comprising a crossing network to swap connections between the current mirror and the terminals of the integrated circuit in response to the polarity signal to ensure that the difference voltage is positive when quantizing the difference voltage.

18. An apparatus for determining a setting specified from a plurality of settings for a function provided in an integrated circuit, the apparatus comprising:
means for connecting a measurement element to a terminal of an integrated circuit, the measurement element including at least one of a resistor, a capacitor, or an inductor;
means for applying a direct current to the terminal of the integrated circuit and producing a voltage at the terminal;
means for quantizing a voltage level of the voltage and producing a quantized voltage; and
means for providing a control signal to a functional module within the integrated circuit, the control signal representing one of a plurality of settings that corresponds to the quantized voltage,
wherein the functional module implements the one of the plurality of settings represented by the control signal.

19. The apparatus of claim 18, further comprising:
means for applying the direct current to a reference terminal of the integrated circuit and producing a reference voltage at the reference terminal, wherein the reference terminal is connected to a reference element, the reference element including at least one of a resistor, a capacitor, or an inductor; and
wherein the means for quantizing a voltage level of the voltage includes means for quantizing a voltage level of a difference voltage representing a voltage difference between the voltage and the reference voltage.

20. The apparatus of claim 19, wherein the means for quantizing a voltage level of a difference voltage includes means for determining a polarity of the difference voltage, and the apparatus further includes:
means for generating a polarity signal based on the determined polarity and using the polarity signal as an additional control signal for the functional module.

* * * * *